United States Patent
Ishikawa et al.

(10) Patent No.: US 10,333,499 B2
(45) Date of Patent: Jun. 25, 2019

(54) SIGNAL TRANSMISSION CIRCUIT AND VEHICLE

(71) Applicant: Rohm Co., Ltd., Kyoto (JP)

(72) Inventors: Toshiyuki Ishikawa, Kyoto (JP); Daiki Yanagishima, Kyoto (JP); Yoshizo Osumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 146 days.

(21) Appl. No.: 15/652,514

(22) Filed: Jul. 18, 2017

(65) Prior Publication Data

US 2018/0026611 A1 Jan. 25, 2018

(30) Foreign Application Priority Data

Jul. 19, 2016 (JP) ................................. 2016-141242

(51) Int. Cl.
*H03K 3/037* (2006.01)
*B60L 11/18* (2006.01)
(Continued)

(52) U.S. Cl.
CPC .......... *H03K 3/037* (2013.01); *B60L 11/1803* (2013.01); *H03K 17/61* (2013.01);
(Continued)

(58) Field of Classification Search
CPC ...... H03K 3/037; H03K 17/61; H03K 17/687; H03K 17/691; H03K 19/20; H04L 25/0266; H04L 25/493; B60L 11/1803
See application file for complete search history.

(56) References Cited

U.S. PATENT DOCUMENTS

| | | |
|---|---|---|
| 2012/0250385 A1 | 10/2012 | Takihara |
| 2014/0002168 A1 | 1/2014 | Yanagishima et al. |
| 2015/0117492 A1 | 4/2015 | Takihara et al. |

FOREIGN PATENT DOCUMENTS

| | | |
|---|---|---|
| JP | H0715949 | 1/1995 |
| JP | 2014-007502 | 1/2014 |

OTHER PUBLICATIONS

European Patent Office; Extended European Search Report, in European Application No. 17182133.3 (dated Dec. 14, 2017).

*Primary Examiner* — Robert L Deberadinis
(74) *Attorney, Agent, or Firm* — Fish & Richardson P.C.

(57) ABSTRACT

A signal transmission circuit which transmits N (N is a natural number of 2 or more) input signals includes a transmission signal generation portion, $2^N$ transmission portions and an output portion. The transmission signal generation portion generates $2^N$ transmission signals according to the N input signals. The $2^N$ transmission portions respectively transmit the $2^N$ transmission signals output from the transmission signal generation portion while performing electrical insulation. The output portion generates and outputs, based on the $2^N$ transmission signals transmitted by the $2^N$ transmission portions, N output signals that respectively indicate the N input signals. The transmission signal generation portion generates a pulse according to the N input signals and incorporates the pulse in only one of the $2^N$ transmission signals at the same time.

16 Claims, 22 Drawing Sheets

(51) Int. Cl.
*H03K 19/20* (2006.01)
*H03K 17/61* (2006.01)
*H03K 17/687* (2006.01)
*H03K 17/691* (2006.01)
*H04L 25/02* (2006.01)
*H04L 25/493* (2006.01)

(52) U.S. Cl.
CPC ......... *H03K 17/687* (2013.01); *H03K 17/691* (2013.01); *H03K 19/20* (2013.01); *H04L 25/0266* (2013.01); *H04L 25/493* (2013.01)

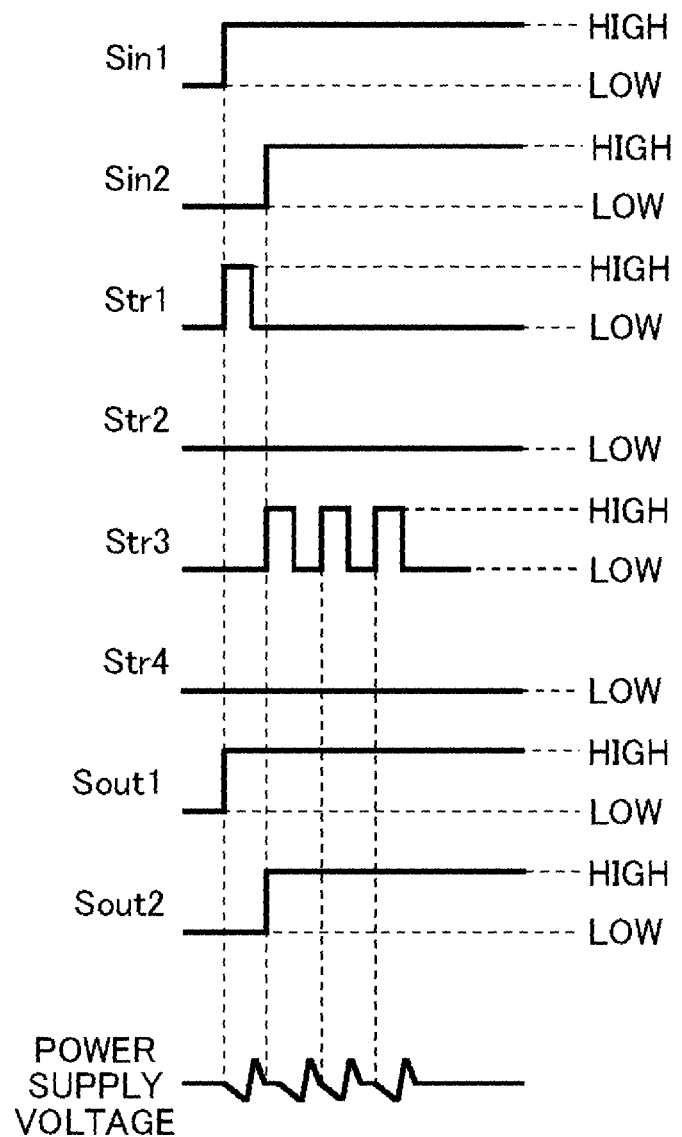

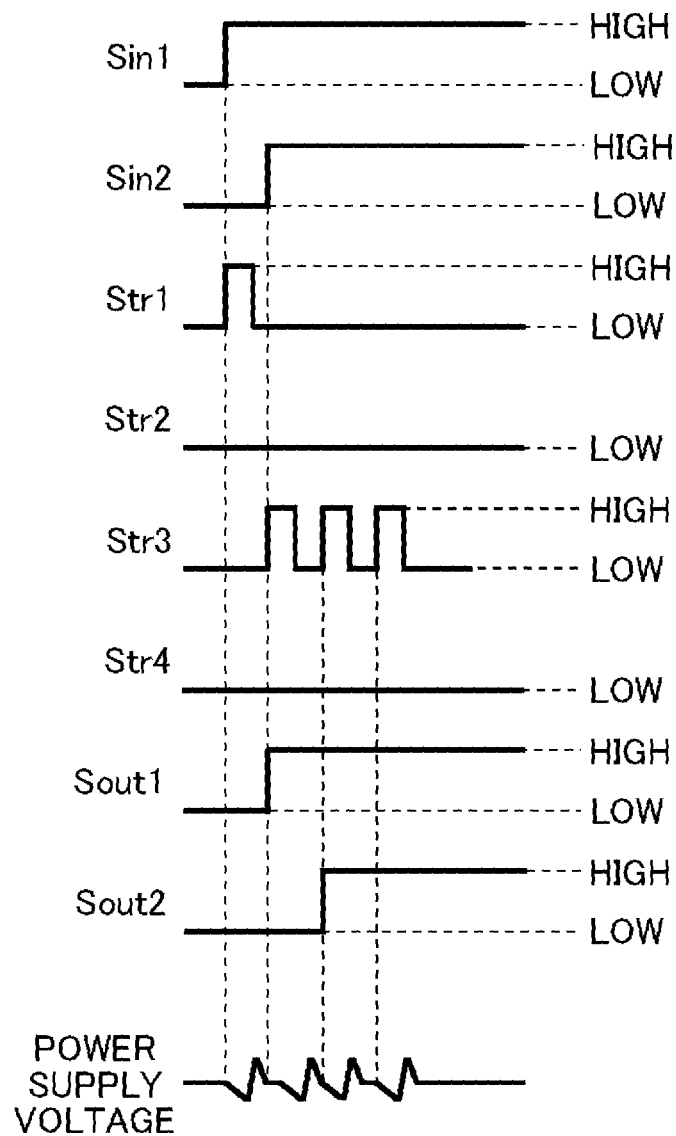

FIG. 7

| PULSE INCORPORATED IN TRANSMISSION SIGNAL | Sout1 | Sout2 |
|---|---|---|
| PULSE INCORPORATED IN Str1 | TURNED HIGH | TURNED LOW |
| PULSE INCORPORATED IN Str2 | TURNED LOW | TURNED LOW |
| PULSE INCORPORATED IN Str3 | TURNED HIGH | TURNED HIGH |
| PULSE INCORPORATED IN Str4 | TURNED LOW | TURNED HIGH |

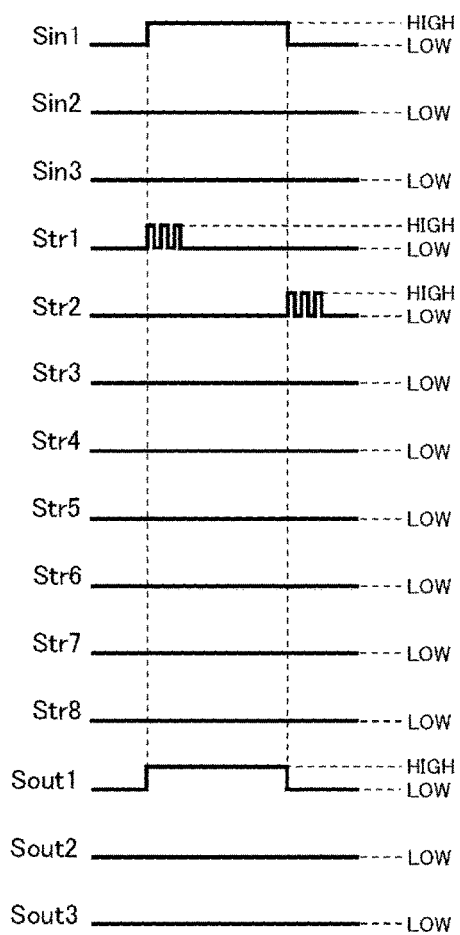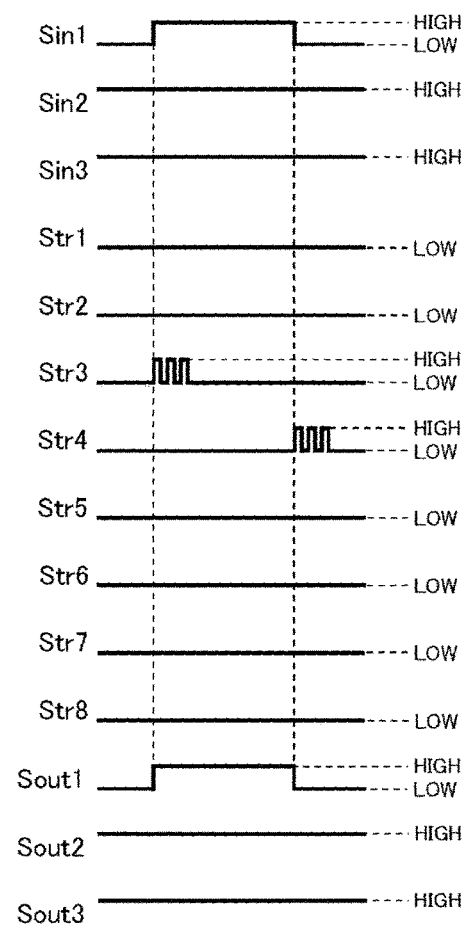

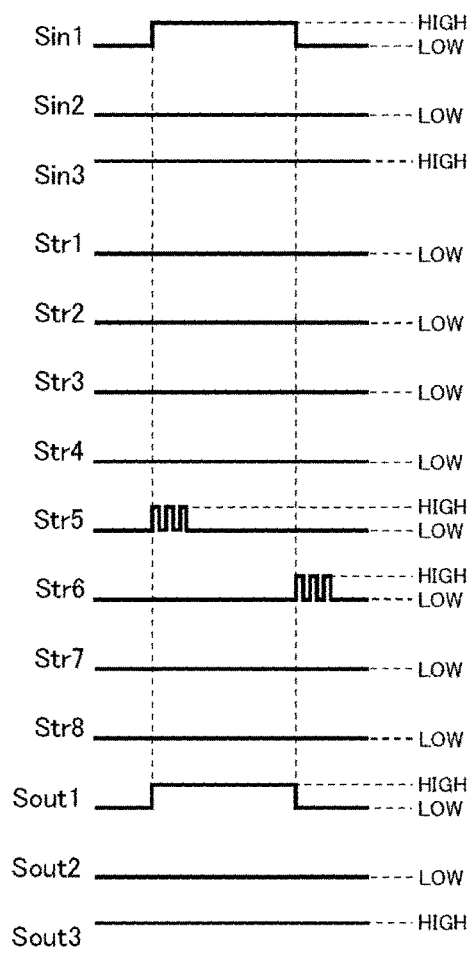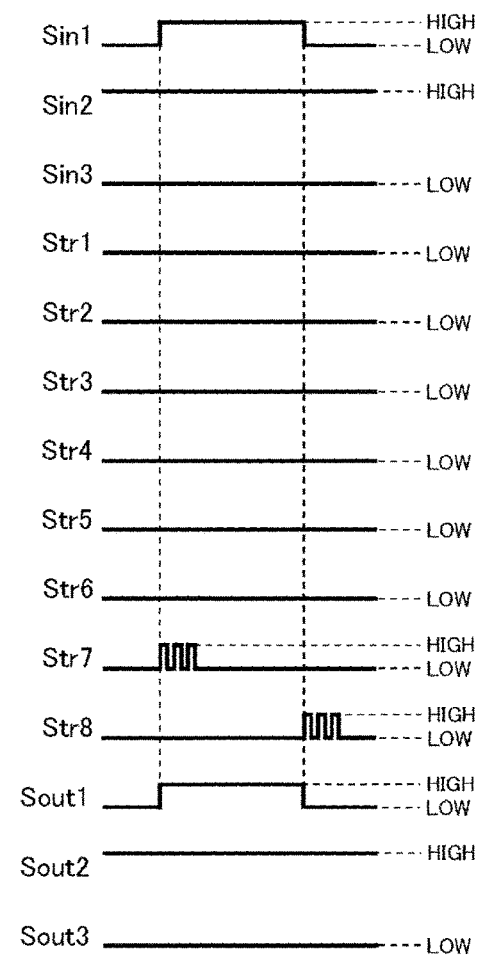

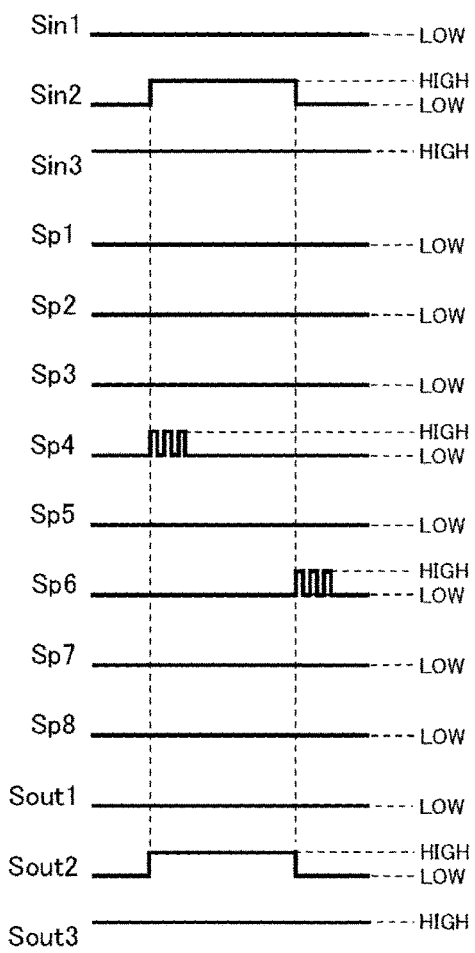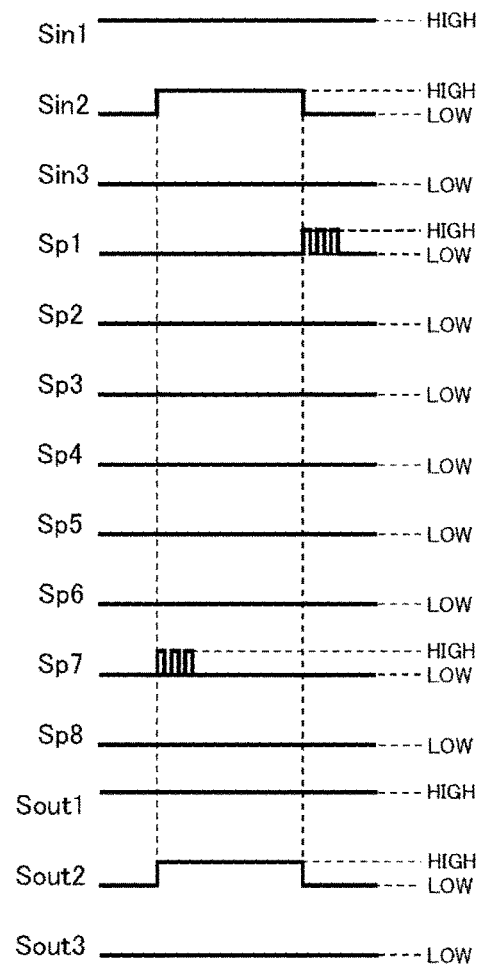

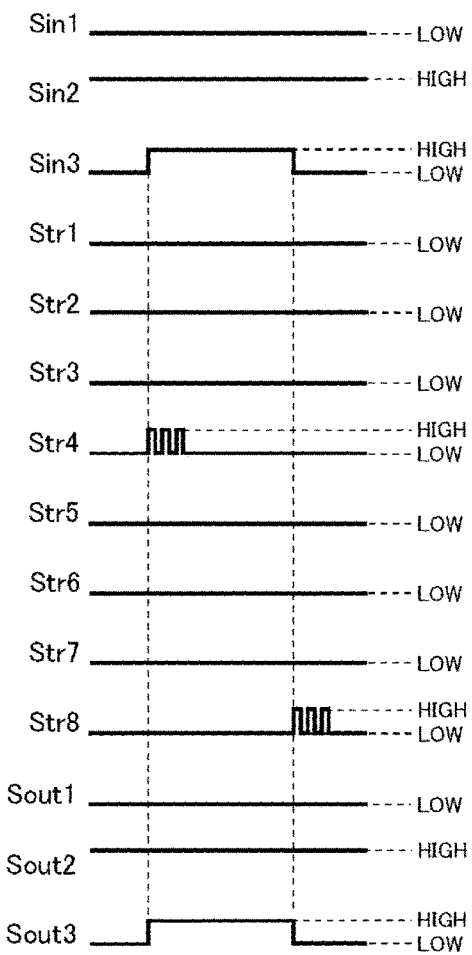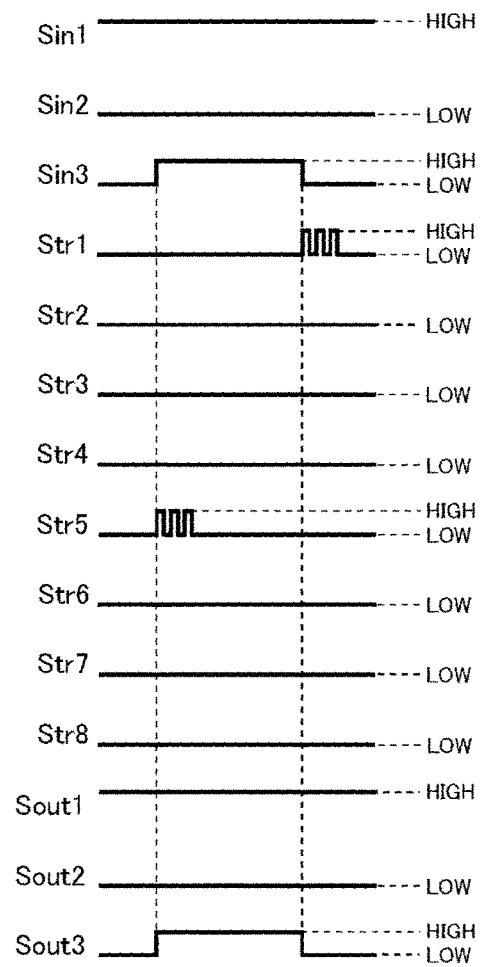

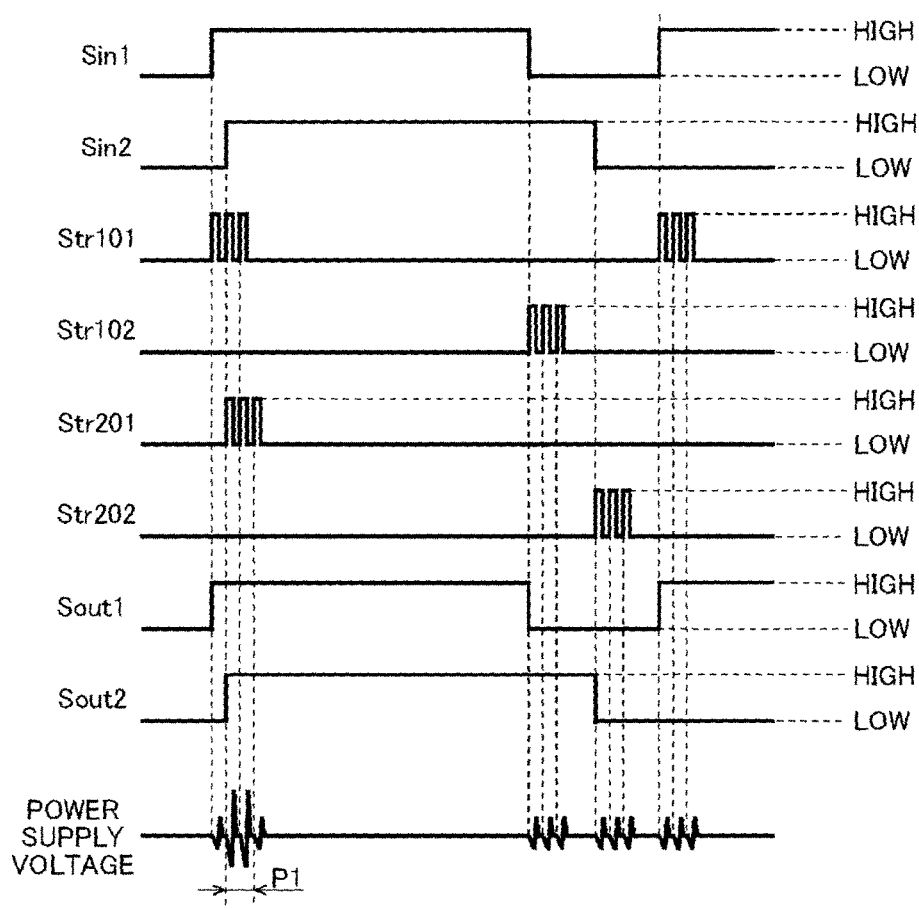

SIGNAL TRANSMISSION CIRCUIT AND VEHICLE

This nonprovisional application claims priority under 35 U.S.C. § 119(a) on Patent Application No. 2016-141242 filed in Japan on Jul. 19, 2016, the entire contents of which are hereby incorporated by reference.

BACKGROUND OF THE INVENTION

Field of the Invention

The present invention relates to a signal transmission circuit which uses an insulating element to transmit an input signal and to a vehicle which uses such a signal transmission circuit.

Description of Related Art

As an example of a signal transmission circuit which uses an insulating element to transmit a single input signal, there can be a signal transmission circuit which is disclosed in Japanese Unexamined Patent Application Publication No. 2014-7502.

FIG. 12 is a diagram showing the configuration of the signal transmission circuit disclosed in Japanese Unexamined Patent Application Publication No. 2014-7502. FIG. 13 is a timing chart showing an example of the operation of the signal transmission circuit shown in FIG. 12.

The signal transmission circuit shown in FIG. 12 includes a pulse generation portion 101, excitation circuits 102 and 103, pulse transformers 104 and 105, pulse detection portions 106 and 107 and a latch circuit 108.

The pulse generation portion 101 generates and outputs transmission signals Str101 and Str102 corresponding to an input signal Sin. When the input signal Sin is switched from low to high, the pulse generation portion 101 generates a pulse and incorporates the pulse in the transmission signal Str101. On the other hand, when the input signal Sin is switched from high to low, the pulse generation portion 101 generates a pulse and incorporates the pulse in the transmission signal Str102. In Japanese Unexamined Patent Application Publication No. 2014-7502, each time the logic of the input signal Sin is switched, one pulse is generated whereas in FIG. 13, each time the logic of the input signal Sin is switched, three pulses are generated at a predetermined period.

The transmission signal Str101 is transmitted by a first transmission portion to the set input terminal (S) of the latch circuit 108. The first transmission portion is formed with the excitation circuit 102, the pulse transformer 104 and the pulse detection portion 106.

The transmission signal Str102 is transmitted by a second transmission portion to the reset input terminal (R) of the latch circuit 108. The second transmission portion is formed with the excitation circuit 103, the pulse transformer 105 and the pulse detection portion 107.

The latch circuit 108 outputs an output signal Sout from an output terminal (Q). When the pulse is input to the set input terminal (S), the latch circuit 108 turns the output signal Sout high. On the other hand, when the pulse is input to the reset input terminal (R), the latch circuit 108 turns the output signal Sout low.

When a plurality of input signals are transmitted, it can be considered that a plurality of signal transmission circuits described above and shown in FIG. 12 are simply used. In the following discussion, a case where two input signals are transmitted will be described as an example. FIG. 14 shows a signal transmission circuit which transmits two input signals. FIG. 15 is a timing chart showing an example of the operation of the signal transmission circuit shown in FIG. 14.

The signal transmission circuit shown in FIG. 14 includes two signal transmission circuits of the same configuration as the signal transmission circuit described above and shown in FIG. 12.

When in the signal transmission circuit shown in FIG. 14, timings at which a pulse is generated in a plurality of transmission signals accidentally coincide with each other (see a period P1 in FIG. 15), a variation in power supply voltage supplied to the signal transmission circuit shown in FIG. 14 is increased. Consequently, the signal transmission circuit shown in FIG. 14 itself or another circuit which shares the power supply voltage with the signal transmission circuit shown in FIG. 14 may be erroneously operated.

Moreover, when in the signal transmission circuit shown in FIG. 14, timings at which a pulse is generated in a plurality of transmission signals accidentally coincide with each other (see the period P1 in FIG. 15), a plurality of pulse transformers are simultaneously driven, and thus radiation noise from the signal transmission circuit shown in FIG. 14 is increased. Consequently, the radiation noise from the signal transmission circuit shown in FIG. 14 may exceed an allowable range.

In order to check whether an abnormality occurs in the transmission of an input signal, a feedback circuit which feeds back a signal indicating the input signal by the transmission of an output signal may be added to the signal transmission circuit shown in FIG. 14. When such an addition is performed, in order to check whether an abnormality occurs in the transmission of a plurality of input signals, it is necessary to prepare the same number of feedback circuits as the input signals in which whether an abnormality occurs in the transmission is checked, with the result that more serious problems are caused by increasing a variation in the power supply voltage and the radiation noise.

SUMMARY OF THE INVENTION

An object of the present invention is to provide a signal transmission circuit which can transmit a plurality of input signals while reducing a variation in power supply voltage and the generation of radiation noise and a vehicle which uses such a signal transmission circuit.

A signal transmission circuit disclosed in the present specification transmits N (N is a natural number of 2 or more) input signals, and includes: a transmission signal generation portion arranged to generate $2^N$ transmission signals according to the N input signals; $2^N$ transmission portions arranged respectively to transmit the $2^N$ transmission signals output from the transmission signal generation portion while performing electrical insulation; and an output portion arranged to generate and output, based on the $2^N$ transmission signals transmitted by the $2^N$ transmission portions, N output signals that respectively indicate the N input signals, and the transmission signal generation portion generates a pulse according to the N input signals and incorporates the pulse in only one of the $2^N$ transmission signals at a same time.

A vehicle disclosed in the present specification includes the signal transmission circuit of the configuration described above.

The significance and effects of the present invention will become more obvious from the description of an embodiment discussed below. However, the embodiment discussed below is only one embodiment of the present invention, and the present invention and the significance of the terms of individual constituent requirements are not limited to the embodiment discussed below.

BRIEF DESCRIPTION OF THE DRAWINGS

FIG. 2B is a timing chart showing an example of the operation of the signal transmission circuit shown in FIG. 1;
FIG. 3B is a timing chart showing another example of the operation of the signal transmission circuit shown in FIG. 1;
FIG. 7 is a diagram showing a relationship between a transmission signal and an output signal;
FIG. 9A is a timing chart showing an example of the operation of the signal transmission circuit shown in FIG. 8;
FIG. 9B is a timing chart showing an example of the operation of the signal transmission circuit shown in FIG. 8;
FIG. 9C is a timing chart showing an example of the operation of the signal transmission circuit shown in FIG. 8;
FIG. 9D is a timing chart showing an example of the operation of the signal transmission circuit shown in FIG. 8;
FIG. 9G is a timing chart showing an example of the operation of the signal transmission circuit shown in FIG. 8;
FIG. 9H is a timing chart showing an example of the operation of the signal transmission circuit shown in FIG. 8;
FIG. 9K is a timing chart showing an example of the operation of the signal transmission circuit shown in FIG. 8;
FIG. 9L is a timing chart showing an example of the operation of the signal transmission circuit shown in FIG. 8;
FIG. 15 is a timing chart showing an example of the operation of the signal transmission circuit shown in FIG. 14.

DETAILED DESCRIPTION OF THE PREFERRED EMBODIMENTS

First Configuration Example

Figure 1:
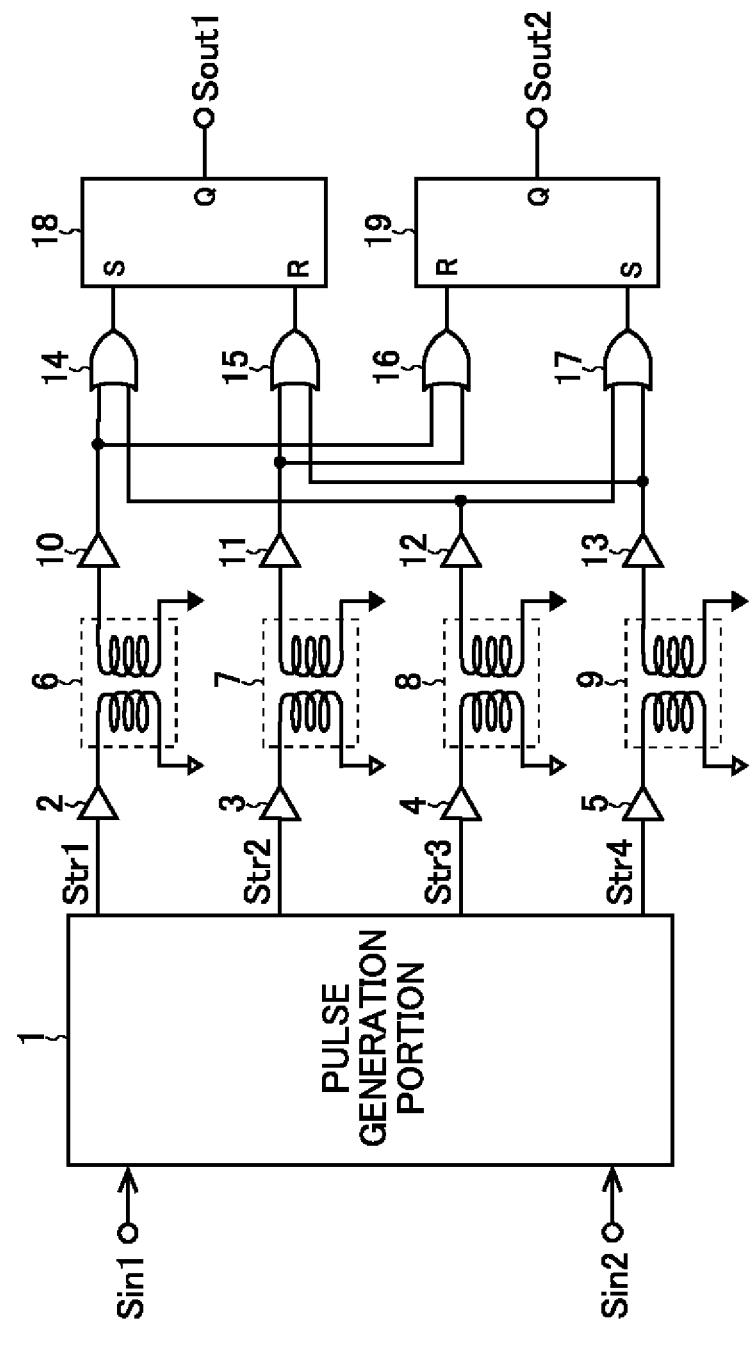
FIG. 1 is a diagram showing a first configuration example of a signal transmission circuit.

FIG. 1 is a diagram showing a first configuration example of a signal transmission circuit. FIGS. 2A, 2B, 3A and 3B are timing charts showing examples of the operation of the signal transmission circuit in the present configuration example.

The signal transmission circuit of the present configuration example includes a pulse generation portion 1, excitation circuits 2 to 5, pulse transformers 6 to 9, pulse detection portions 10 to 13, OR gates 14 to 17 and latch circuits 18 and 19.

The pulse generation portion 1 detects the switching of the logic of each of input signals Sin1 and Sin2, and generates pulses according to the result of the detection. The pulse generation portion 1 incorporates the pulses in only one of four transmission signals Str1 to Str4 at the same time.

Figure 2A:
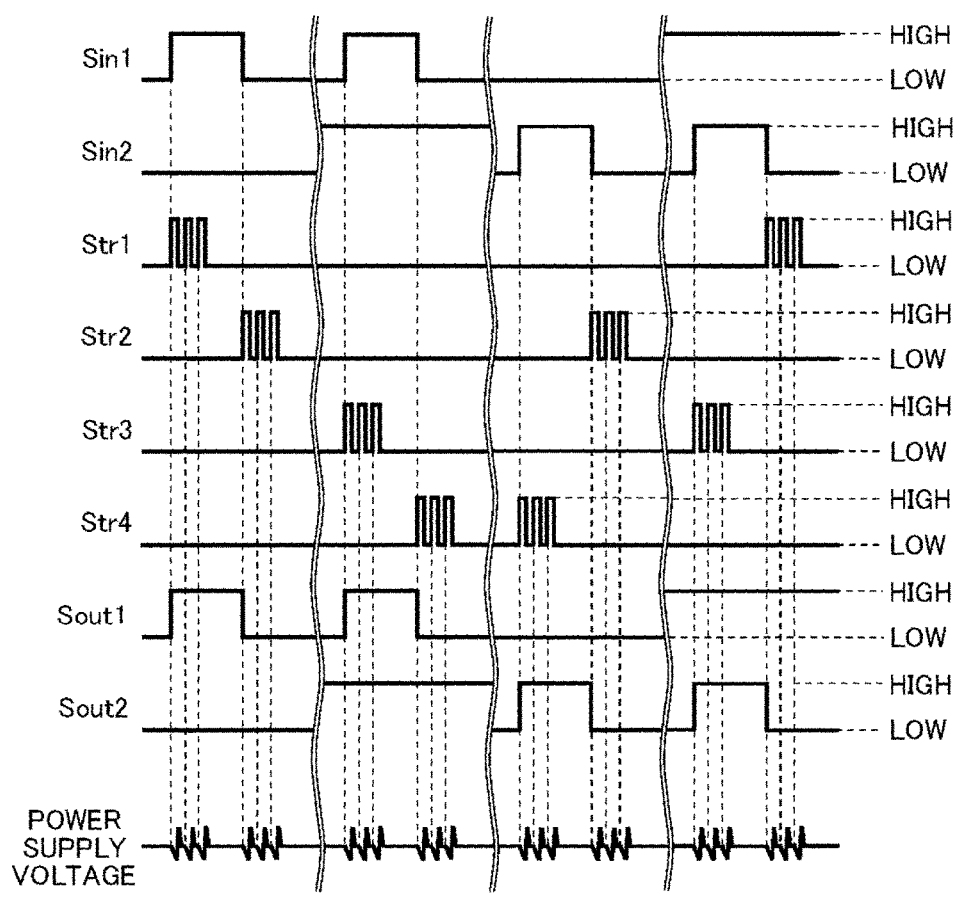
FIG. 2A is a timing chart showing an example of the operation of the signal transmission circuit shown in FIG. 1.

When the input signal Sin2 is low, and the input signal Sin1 is switched from low to high, the pulse generation portion 1 generates three pulses at a predetermined period and incorporates the three pulses in the transmission signal Str1 (see FIG. 2A). On the other hand, when the input signal Sin2 is low, and the input signal Sin1 is switched from high to low, the pulse generation portion 1 generates three pulses at the predetermined period and incorporates the three pulses in the transmission signal Str2 (see FIG. 2A).

When the input signal Sin2 is high, and the input signal Sin1 is switched from low to high, the pulse generation portion 1 generates three pulses at the predetermined period and incorporates the three pulses in the transmission signal Str3 (see FIG. 2A). On the other hand, when the input signal Sin2 is high, and the input signal Sin1 is switched from high to low, the pulse generation portion 1 generates three pulses at the predetermined period and incorporates the three pulses in the transmission signal Str4 (see FIG. 2A).

When the input signal Sin1 is low, and the input signal Sin2 is switched from low to high, the pulse generation portion 1 generates three pulses at the predetermined period and incorporates the three pulses in the transmission signal Str4 (see FIG. 2A). On the other hand, when the input signal Sin1 is low, and the input signal Sin2 is switched from high to low, the pulse generation portion 1 generates three pulses at the predetermined period and incorporates the three pulses in the transmission signal Str2 (see FIG. 2A).

When the input signal Sin1 is high, and the input signal Sin2 is switched from low to high, the pulse generation portion 1 generates three pulses at the predetermined period and incorporates the three pulses in the transmission signal Str3 (see FIG. 2A). On the other hand, when the input signal Sin1 is high, and the input signal Sin2 is switched from high to low, the pulse generation portion 1 generates three pulses at the predetermined period and incorporates the three pulses in the transmission signal Str1 (see FIG. 2A).

While the pulse generation portion 1 detects the switching of the logic of the input signal Sin1, and generates three pulses at the predetermined period, when the pulse generation portion 1 detects the switching of the logic of the input signal Sin2, the pulse generation portion 1 stops the generation of the three pulses resulting from the former detection partway, and performs the generation of the three pulses resulting from the latter detection. In this way, even when the logic of the input signal Sin2 is switched immediately after the switching of the logic of the input signal Sin1, it is possible to incorporate the pulses in only one of the four transmission signals Str1 to Str4 at the same time.

FIG. 2B shows an operation while the pulse generation portion 1 detects the switching of the input signal Sin1 from low to high, and generates three pulses at the predetermined period when the pulse generation portion 1 detects the switching of the input signal Sin2 from low to high. In the operation shown in FIG. 2B, three pulses are not incorporated in the transmission signal Str1 but one pulse is incorporated therein. However, the one pulse incorporated in the transmission signal Str1 is input to the set input terminal (S) of the latch circuit 18, and then three pulses incorporated in the transmission signal Str2 are input thereto.

The pulse generation portion 1 likewise stops the generation of the three pulses resulting from the former detection partway, and performs the generation of three pulses resulting from the latter detection even in the following cases of (1) to (7):

(1) while the pulse generation portion 1 detects the switching of the input signal Sin2 from low to high, and generates three pulses at the predetermined period, when the pulse generation portion 1 detects the switching of the input signal Sin1 from low to high;

(2) while the pulse generation portion 1 detects the switching of the input signal Sin1 from high to low, and generates three pulses at the predetermined period, when the pulse generation portion 1 detects the switching of the input signal Sin2 from high to low;

(3) while the pulse generation portion 1 detects the switching of the input signal Sin2 from high to low, and generates three pulses at the predetermined period, when the pulse generation portion 1 detects the switching of the input signal Sin1 from high to low;

(4) while the pulse generation portion 1 detects the switching of the input signal Sin1 from low to high, and generates three pulses at the predetermined period, when the pulse generation portion 1 detects the switching of the input signal Sin2 from high to low;

(5) while the pulse generation portion 1 detects the switching of the input signal Sin2 from low to high, and generates three pulses at the predetermined period, when the pulse generation portion 1 detects the switching of the input signal Sin1 from high to low;

(6) while the pulse generation portion 1 detects the switching of the input signal Sin1 from high to low, and generates three pulses at the predetermined period, when the pulse generation portion 1 detects the switching of the input signal Sin2 from low to high; and (7) while the pulse generation portion 1 detects the switching of the input signal Sin2 from high to low, and generates three pulses at the predetermined period, when the pulse generation portion 1 detects the switching of the input signal Sin1 from low to high.

The pulse generation portion 1 respectively outputs the four transmission signals Str1 to Str4 to first to fourth transmission portions.

The transmission signal Str1 is transmitted by the first transmission portion to the first input terminal of the OR gate 14 and the first input terminal of the OR gate 16. The first transmission portion is formed with the excitation circuit 2, the pulse transformer 6 and the pulse detection portion 10.

The transmission signal Str2 is transmitted by the second transmission portion to the first input terminal of the OR gate 15 and the second input terminal of the OR gate 16. The second transmission portion is formed with the excitation circuit 3, the pulse transformer 7 and the pulse detection portion 11.

The transmission signal Str3 is transmitted by the third transmission portion to the second input terminal of the OR gate 14 and the first input terminal of the OR gate 17. The third transmission portion is formed with the excitation circuit 4, the pulse transformer 8 and the pulse detection portion 12.

The transmission signal Str4 is transmitted by the fourth transmission portion to the second input terminal of the OR gate 15 and the second input terminal of the OR gate 17. The fourth transmission portion is formed with the excitation circuit 5, the pulse transformer 9 and the pulse detection portion 13.

The excitation circuits 2 to 5 respectively excite the pulse transformers 6 to 9 based on the transmission signals Str1 to Str4. The pulse detection portions 10 to 13 respectively detect pulses output from the secondary sides of the pulse transformers 6 to 9. The first to fourth transmission portions respectively transmit the transmission signals Str1 to Str4 while electrically insulating an input side and an output side with the pulse transformers 6 to 9.

The output of the OR gate 14 is transmitted to the set input terminal (S) of the latch circuit 18, and the output of the OR gate 15 is transmitted to the reset input terminal (R) of the latch circuit 18. The latch circuit 18 outputs an output signal Sout1 from an output terminal (Q). When the pulse is input to the set input terminal (S), the latch circuit 18 turns the output signal Sout1 high. On the other hand, when the pulse is input to the reset input terminal (R), the latch circuit 18 turns the output signal Sout1 low. The output signal Sout1 becomes a signal which indicates the input signal Sin1 (see FIG. 2A).

The output of the OR gate 16 is transmitted to the reset input terminal (R) of the latch circuit 19, and the output of the OR gate 17 is transmitted to the set input terminal (S) of the latch circuit 19. The latch circuit 19 outputs an output signal Sout2 from the output terminal (Q). When the pulse is input to the set input terminal (S), the latch circuit 19 turns the output signal Sout2 high. On the other hand, when the pulse is input to the reset input terminal (R), the latch circuit 19 turns the output signal Sout2 low. The output signal Sout2 becomes a signal which indicates the input signal Sin2 (see FIG. 2A).

The signal transmission circuit shown in FIG. 1 incorporates the pulses in only one of the four transmission signals Str1 to Str4 at the same time, and thus it is possible to reduce a variation in power supply voltage supplied to the signal transmission circuit shown in FIG. 1. In this way, the signal transmission circuit shown in FIG. 1 itself or another circuit which shares the power supply voltage with the signal transmission circuit shown in FIG. 1 can be prevented from being erroneously operated.

The signal transmission circuit shown in FIG. 1 incorporates the pulses in only one of the four transmission signals Str1 to Str4 at the same time, and thus it is possible to reduce radiation noise from the signal transmission circuit shown in FIG. 1. In this way, the radiation noise from the signal transmission circuit shown in FIG. 1 can be prevented from exceeding an allowable range.

Although in the present configuration example, when the logic of the input signal is switched, the pulse generation portion 1 generates, in principle, three pulses at the predetermined period, the number of pulses generated each time the logic of the input signal is switched may be at least one. When a plurality of pulses are generated each time the logic of the input signal is switched, the number of pulses generated is not limited to three, and may be two or four or more. Even when as in the present configuration example, a plurality of pulses are generated each time the logic of the input signal is switched, and thus the latch circuit cannot recognize the first pulse due to any failure, a failure is prevented from occurring in the signal transmission if the latch circuit can recognize any of the remaining pulses.

Figure 3A:
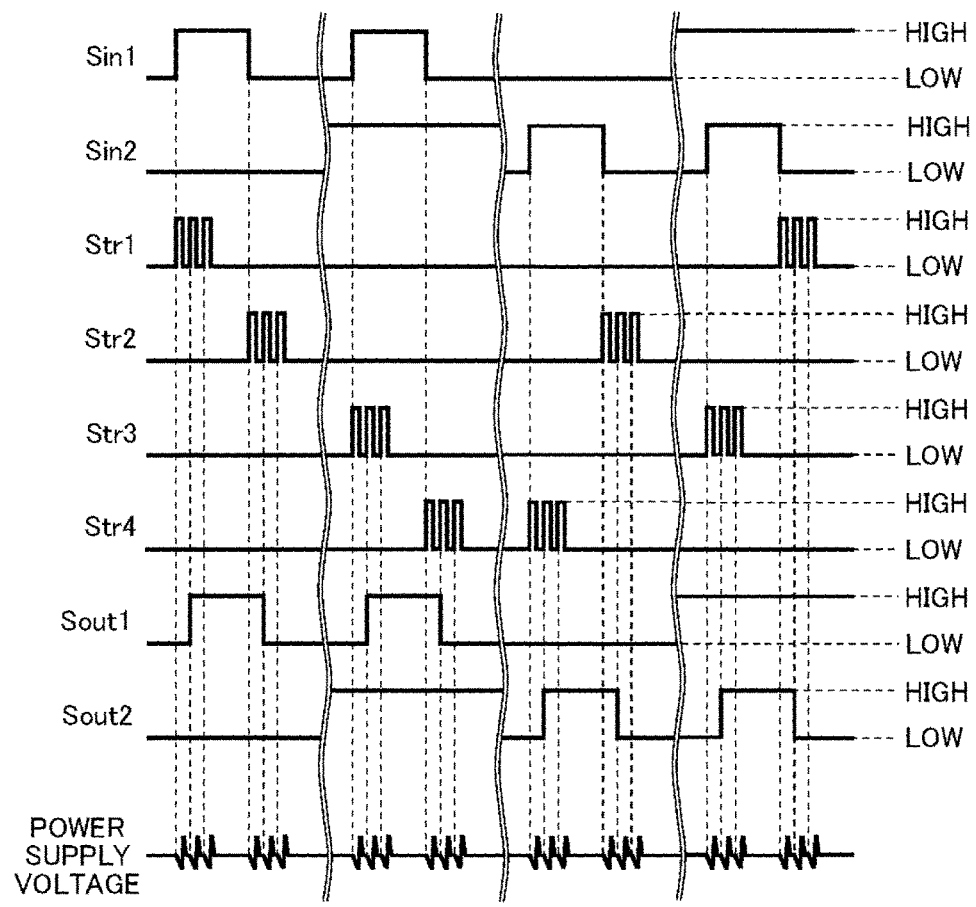
FIG. 3A is a timing chart showing another example of the operation of the signal transmission circuit shown in FIG. 1.

A configuration may be adopted in which a counter for the set input terminal (S) and a counter for the reset input terminal (R) are incorporated in each of the latch circuits 18 and 19, and in which the signal transmission circuit shown in FIG. 1 performs the operation shown in FIG. 3A.

In the operation shown in FIG. 3A, the latch circuit 18 turns the output signal Sout1 high when two pulses are input to the set input terminal (S) whereas the latch circuit 18 turns the output signal Sout1 low when two pulses are input to the reset input terminal (R). In the operation shown in FIG. 3A, the latch circuit 19 turns the output signal Sout2 high when two pulses are input to the set input terminal (S) whereas the latch circuit 19 turns the output signal Sout2 low when two pulses are input to the reset input terminal (R)

As described previously, while the pulse generation portion 1 detects the switching of the logic of the input signal Sin1, and generates three pulses at the predetermined period, when the pulse generation portion 1 detects the switching of the logic of the input signal Sin2, the pulse generation portion 1 stops the generation of the three pulses resulting from the former detection partway, and performs the generation of the three pulses resulting from the latter detection. In this way, even when the logic of the input signal Sin2 is switched immediately after the switching of the logic of the input signal Sin1, it is possible to incorporate the pulses in only one of the four transmission signals Str1 to Str4 at the same time.

FIG. 3B shows an operation while the pulse generation portion 1 detects the switching of the input signal Sin1 from low to high, and generates three pulses at the predetermined period when the pulse generation portion 1 detects the switching of the input signal Sin2 from low to high. In the operation shown in FIG. 3B, three pulses are not incorporated in the transmission signal Str1 but one pulse is incorporated therein. However, the one pulse incorporated in the transmission signal Str1 is input to the set input terminal (S) of the latch circuit 18, and then three pulses incorporated in the transmission signal Str2 are input thereto. Hence, when two pulses are input to the set input terminal (S) of the latch circuit 18, the output signal Sout1 is turned high.

When the counter for the set input terminal (S) and the counter for the reset input terminal (R) are incorporated in each of the latch circuits 18 and 19, the number of pulses generated each time the logic of the input signal is switched may be at least two. However, the number of pulses generated each time the logic of the input signal is switched needs to be set equal to or more than the number of pulses necessary for setting and resetting the latch circuits 18 and 19. When the number of pulses generated each time the logic of the input signal is switched is set more than the number of pulses necessary for setting and resetting the latch circuits 18 and 19, even if the latch circuit cannot recognize any pulses due to any failure, a failure is prevented from occurring in the signal transmission if the latch circuit can recognize the number of pulses necessary for the setting and resetting.

Second Configuration Example

Figure 4:
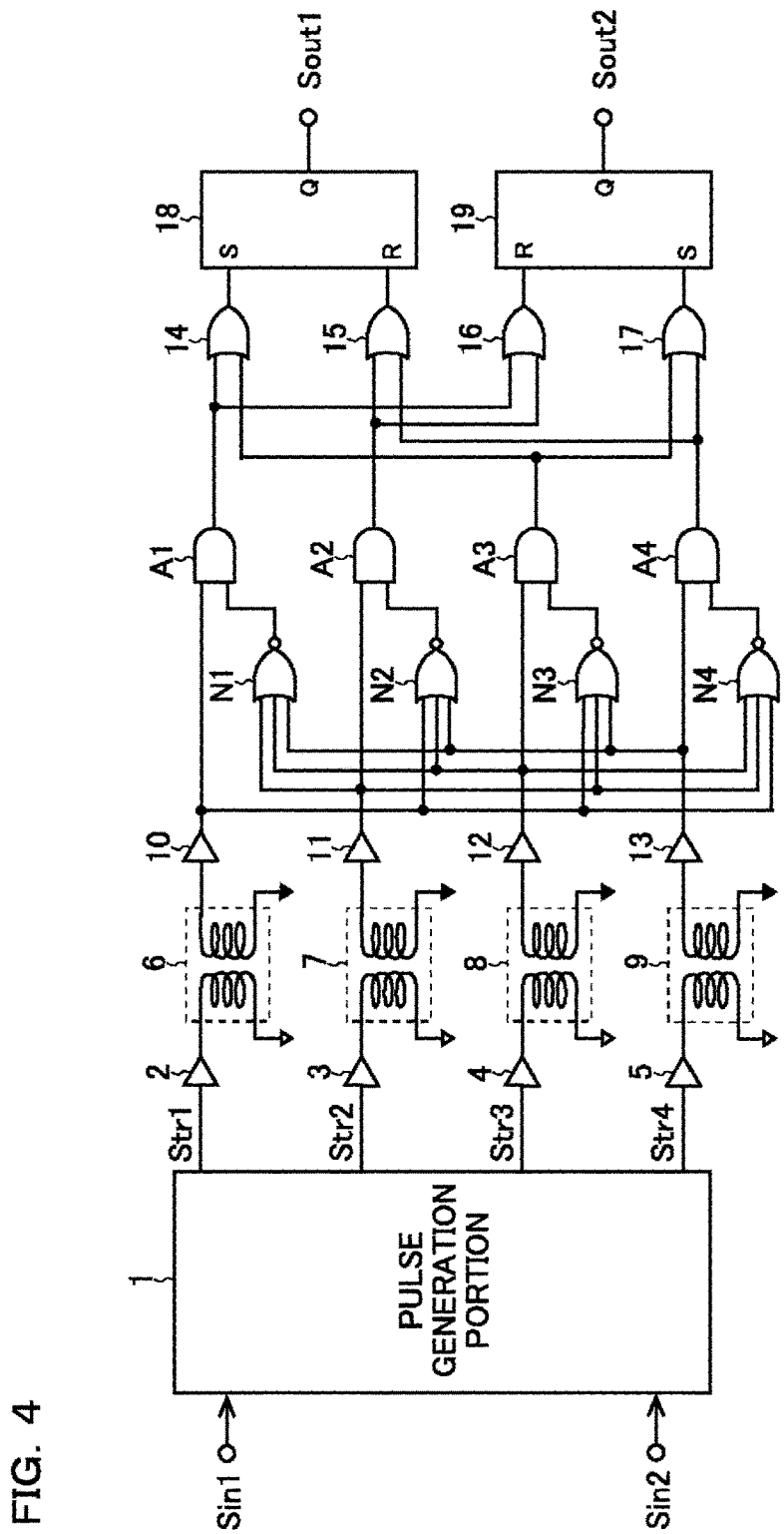
FIG. 4 is a diagram showing a second configuration example of the signal transmission circuit.

FIG. 4 is a diagram showing a second configuration example of the signal transmission circuit. In the signal transmission circuit of the present configuration example, a relay portion is added to the signal transmission circuit of the first configuration example. In the present configuration example, the description of the same portions as in the first configuration example will be omitted.

The relay portion is provided between the pulse detection portions 10 to 13 and the OR gates 14 to 17. The relay portion is formed with NOR gates N1 to N4 and AND gates A1 to A4.

The output of the pulse detection portion 11 is transmitted to the first input terminal of the NOR gate N1, the output of the pulse detection portion 12 is transmitted to the second input terminal of the NOR gate N1 and the output of the pulse detection portion 13 is transmitted to the third input terminal of the NOR gate N1. The output of the pulse detection portion 10 is transmitted to the first input terminal of the AND gate A1, and the output of the NOR gate N1 is transmitted to the second input terminal of the AND gate A1. The output of the AND gate A1 is transmitted to the first input terminal of the OR gate 14 and the first input terminal of the OR gate 16. Hence, when the pulses are incorporated in the transmission signal Str1, and at least one of the transmission signals Str2 to Str4 transmitted by the second to fourth transmission portions is turned high, the relay portion stops the transmission of the pulses incorporated in the transmission signal Str1 to the OR gates 14 and 16.

The output of the pulse detection portion 10 is transmitted to the first input terminal of the NOR gate N2, the output of the pulse detection portion 12 is transmitted to the second input terminal of the NOR gate N2 and the output of the pulse detection portion 13 is transmitted to the third input terminal of the NOR gate N2. The output of the pulse detection portion 11 is transmitted to the first input terminal of the AND gate A2, and the output of the NOR gate N2 is transmitted to the second input terminal of the AND gate A2. The output of the AND gate A2 is transmitted to the first input terminal of the OR gate 15 and the second input terminal of the OR gate 16. Hence, when the pulses are incorporated in the transmission signal Str2, and at least one of the transmission signals Str1, Str3 and Str4 respectively transmitted by the first, third and fourth transmission portions is turned high, the relay portion stops the transmission of the pulses incorporated in the transmission signal Str2 to the OR gates 15 and 16.

The output of the pulse detection portion 10 is transmitted to the first input terminal of the NOR gate N3, the output of the pulse detection portion 11 is transmitted to the second input terminal of the NOR gate N3 and the output of the pulse detection portion 13 is transmitted to the third input terminal of the NOR gate N3. The output of the pulse detection portion 12 is transmitted to the first input terminal of the AND gate A3, and the output of the NOR gate N3 is transmitted to the second input terminal of the AND gate A3. The output of the AND gate A3 is transmitted to the first input terminal of the OR gate 14 and the first input terminal of the OR gate 17. Hence, when the pulses are incorporated in the transmission signal Str3, and at least one of the transmission signals Str1, Str2 and Str4 respectively transmitted by the first, second and fourth transmission portions is turned high, the relay portion stops the transmission of the pulses incorporated in the transmission signal Str3 to the OR gates 14 and 17.

The output of the pulse detection portion 12 is transmitted to the first input terminal of the NOR gate N4, the output of the pulse detection portion 11 is transmitted to the second input terminal of the NOR gate N4 and the output of the pulse detection portion 10 is transmitted to the third input terminal of the NOR gate N4. The output of the pulse detection portion 13 is transmitted to the first input terminal of the AND gate A4, and the output of the NOR gate N4 is transmitted to the second input terminal of the AND gate A4. The output of the AND gate A4 is transmitted to the second input terminal of the OR gate 15 and the second input terminal of the OR gate 17. Hence, when the pulses are incorporated in the transmission signal Str4, and at least one of the transmission signals Str1 to Str3 respectively transmitted by the first to third transmission portions is turned high, the relay portion stops the transmission of the pulses incorporated in the transmission signal Str4 to the OR gates 15 and 17.

As described above, when at least one of the transmission signals Str1 to Str4 is erroneously turned high due to noise or the like, the relay portion stops the transmission of the pulses incorporated in the transmission signals Str1 to Str4, with the result that an erroneous signal is prevented from being transmitted. A configuration in which the NOR gate N1 is not provided and in which any one of the outputs of the pulse detection portions 11 to 13 is transmitted to the second input terminal of the AND gate A1 or a configuration in which instead of the NOR gate N1 that is a three-input NOR gate, a two-input NOR gate is provided and in which any two of the outputs of the pulse detection portions 11 to 13 are transmitted to the two-input NOR gate may be adopted. The same variation can be performed on each of the NOR gates N2 to N4.

Third Configuration Example

Figure 5:
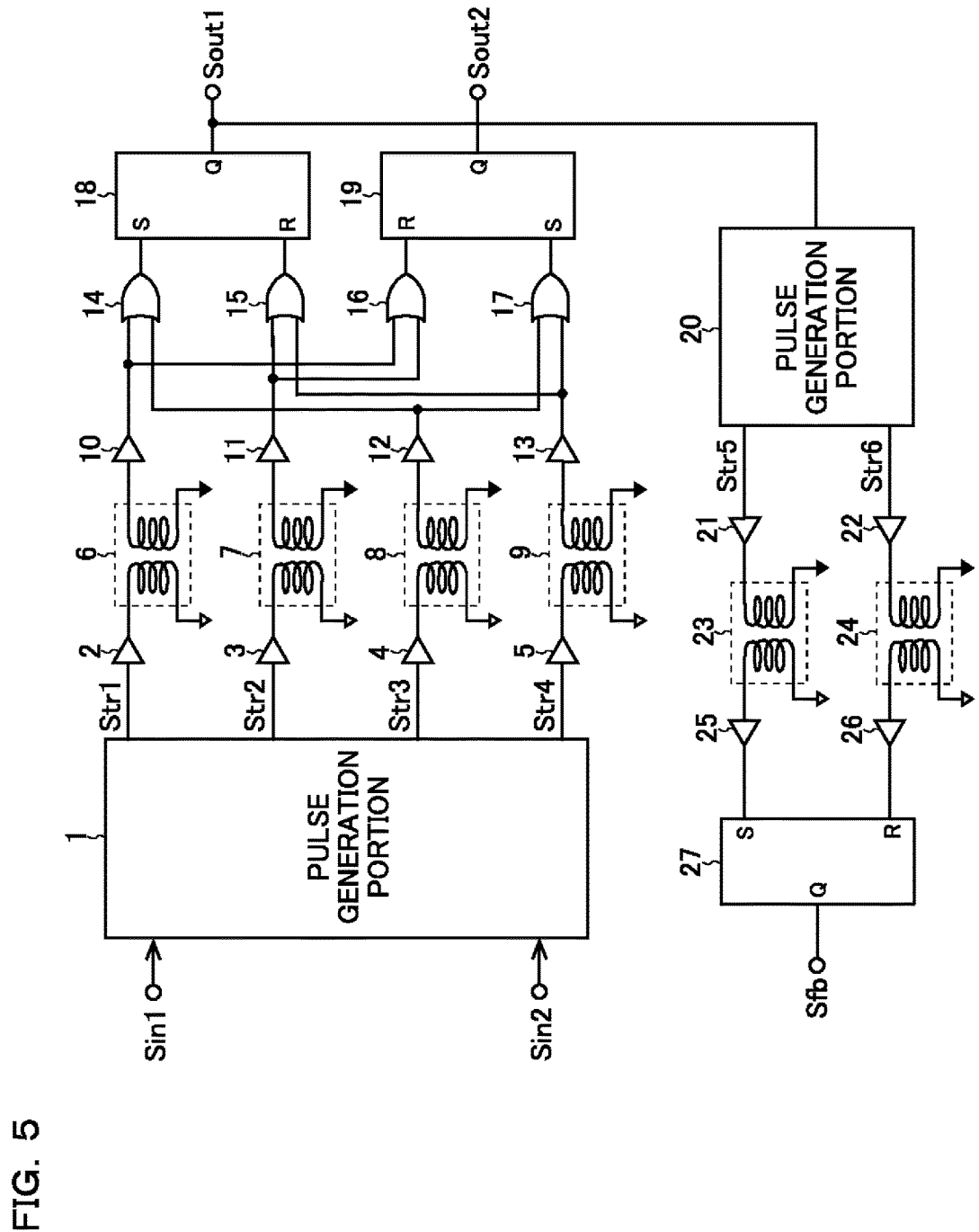
FIG. 5 is a diagram showing a third configuration example of the signal transmission circuit.

FIG. 5 is a diagram showing a third configuration example of the signal transmission circuit. In the signal transmission circuit of the present configuration example, a feedback circuit is added to the signal transmission circuit of the first configuration example. In the present configuration example, the description of the same portions as in the first configuration example will be omitted.

The feedback circuit is formed with a pulse generation portion 20, excitation circuits 21 and 22, pulse transformers 23 and 24, pulse detection circuits 25 and 26 and a latch circuit 27.

The pulse generation portion 20 detects the switching of the logic of the output signal Sout1, and generates pulses according to the result of the detection. The pulse generation portion 20 incorporates the pulses in only one of two feedback transmission signals Str5 and Str6 at the same time.

Figure 6:
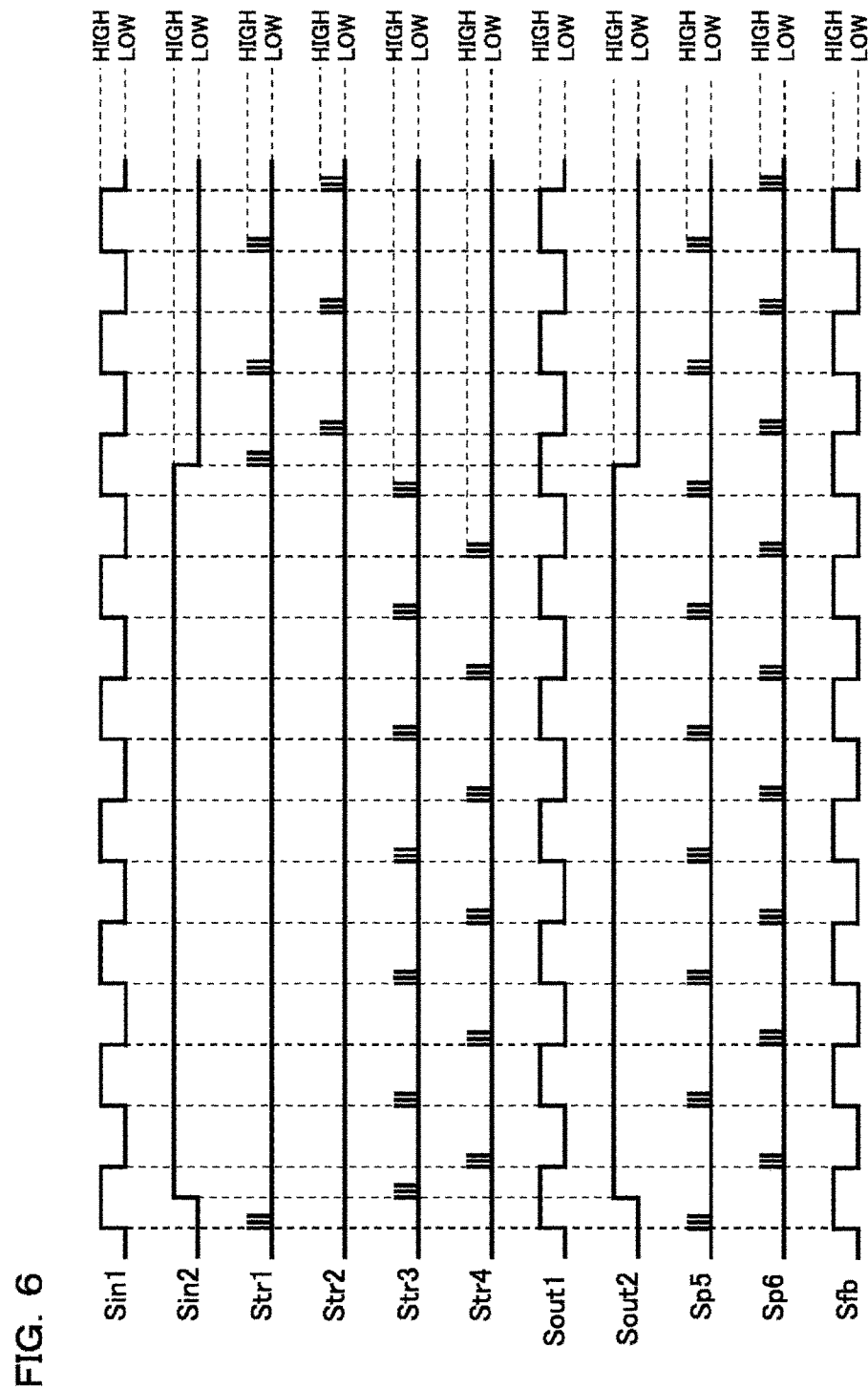
FIG. 6 is a timing chart showing an example of the operation of the signal transmission circuit shown in FIG. 5.

When the output signal Sout1 is switched from low to high, the pulse generation portion 20 generates three pulses at the predetermined period and incorporates the three pulses in the feedback transmission signal Str5 (see FIG. 6). On the other hand, when the output signal Sout1 is switched from high to low, the pulse generation portion 20 generates three pulses at the predetermined period and incorporates the three pulses in the feedback transmission signal Str6 (see FIG. 6).

The pulse generation portion 20 respectively outputs the two feedback transmission signals Str5 and Str6 to first and second feedback transmission portions.

The feedback transmission signal Str5 is transmitted by the first feedback transmission portion to the set input terminal (S) of the latch circuit 27. The first feedback transmission portion is formed with the excitation circuit 21, the pulse transformer 23 and the pulse detection portion 25.

The feedback transmission signal Str6 is transmitted by the second feedback transmission portion to the reset input terminal (R) of the latch circuit 27. The second feedback transmission portion is formed with the excitation circuit 22, the pulse transformer 24 and the pulse detection portion 26.

The excitation circuits 21 and 22 respectively excite the pulse transformers 23 and 24 based on the feedback transmission signals Str5 and Str6. The pulse detection portions 25 and 26 respectively detect pulses output from the secondary sides of the pulse transformers 23 and 24. The first and second feedback transmission portions respectively transmit the feedback transmission signals Str5 and Str6 while electrically insulting an input side and an output side with the pulse transformers 23 and 24.

The latch circuit 27 outputs a feedback signal Sfb from the output terminal (Q). When the pulse is input to the set input terminal (S), the latch circuit 27 turns the feedback signal Sfb high. On the other hand, when the pulse is input to the reset input terminal (R), the latch circuit 27 turns the feedback signal Sfb low.

When no abnormality occurs in the transmission of the input signal Sin1 and in the feedback transmission of the output signal Sout1, the feedback signal Sfb becomes a signal which indicates the input signal Sin1 (see FIG. 6). Hence, in the signal transmission circuit of the present configuration example, on the primary side of the pulse transformers 6 to 9 and the secondary side of the pulse transformers 23 and 24, a relationship between the input signal Sin1 and the feedback signal Sfb is checked, and thus it is possible to determine whether or not an abnormality occurs in the transmission of the input signal Sin1.

Although the pulse which switches the logic of the output signal Sout1 is incorporated in any of the transmission signals Str1 to Str4, the pulse incorporated in the transmission signals Str1 to Str4 is also a pulse which switches the logic of the output signal Sout2 (see FIG. 7). Hence, when as shown in FIG. 6, the period of the input signal Sin1 is sufficiently shorter than that of the input signal Sin2, the relationship between the input signal Sin1 and the feedback signal Sfb is checked, and thus it is possible not only to determine whether or not an abnormality occurs in the transmission of the input signal Sin1 but also to determine whether or not an abnormality occurs in the transmission of the input signal Sin2.

In the signal transmission circuit of the present configuration example, the number of feedback circuits is restricted to one, and thus it is possible to minimize an increase in the variation of the power supply voltage and an increase in the radiation noise caused by the addition of the feedback circuit.

Fourth Configuration Example

Although in the signal transmission circuits of the first to third configuration examples described above, the two input signals Sin1 and Sin2 are transmitted, the number of input signals transmitted may be three or more.

Figure 8:
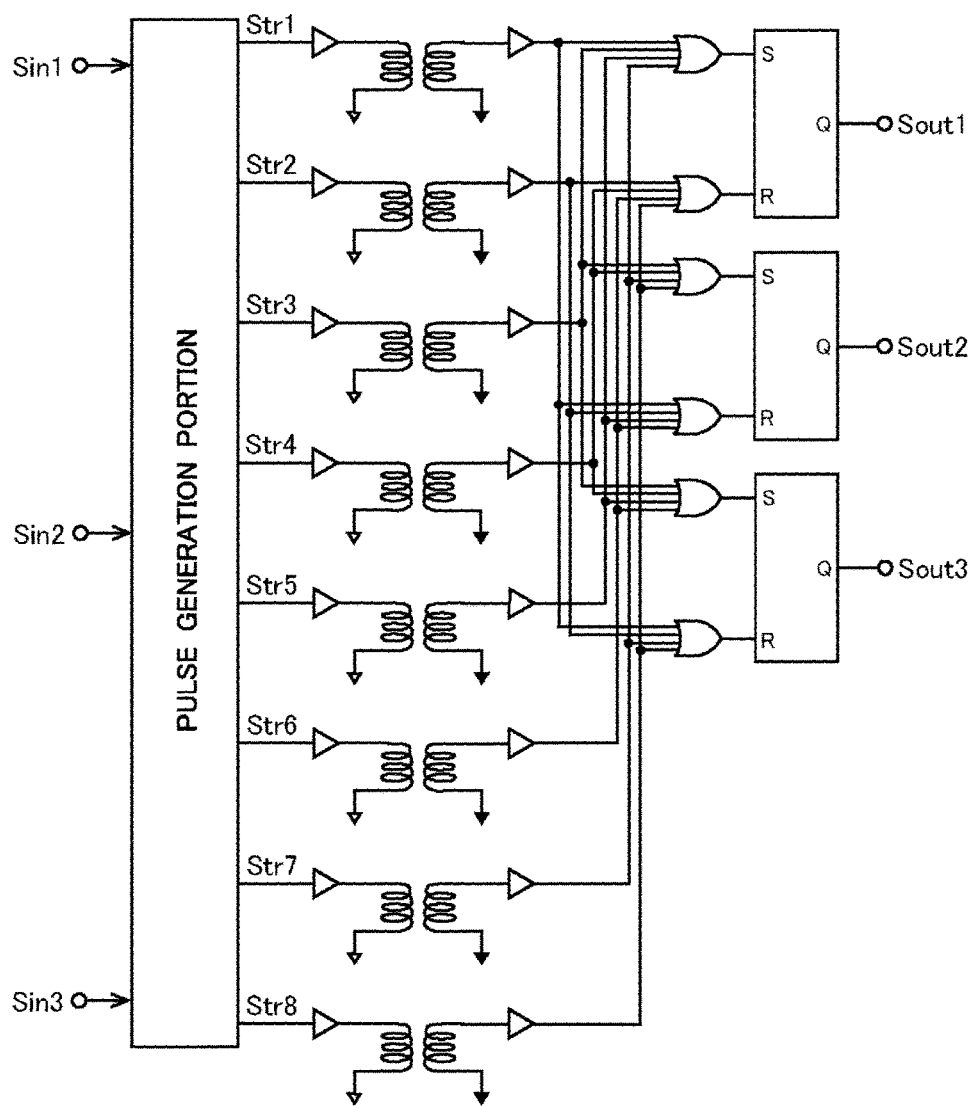
FIG. 8 is a diagram showing a fourth configuration example of the signal transmission circuit.
Figure 9E:
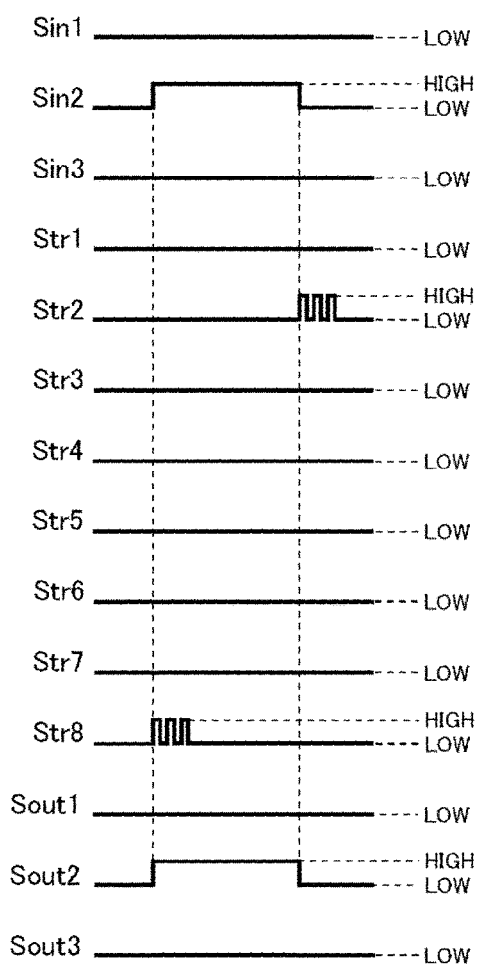
FIG. 9E is a timing chart showing an example of the operation of the signal transmission circuit shown in FIG. 8.
Figure 9F:
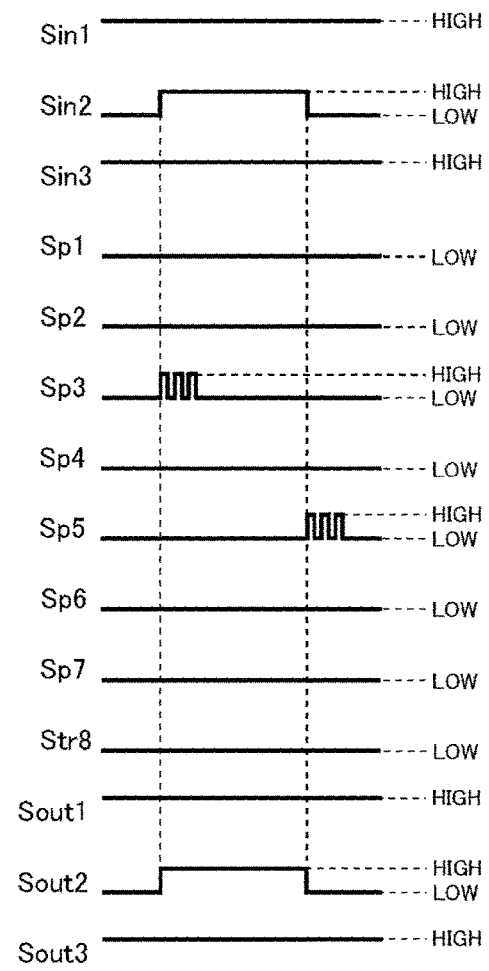
FIG. 9F is a timing chart showing an example of the operation of the signal transmission circuit shown in FIG. 8.
Figure 9I:
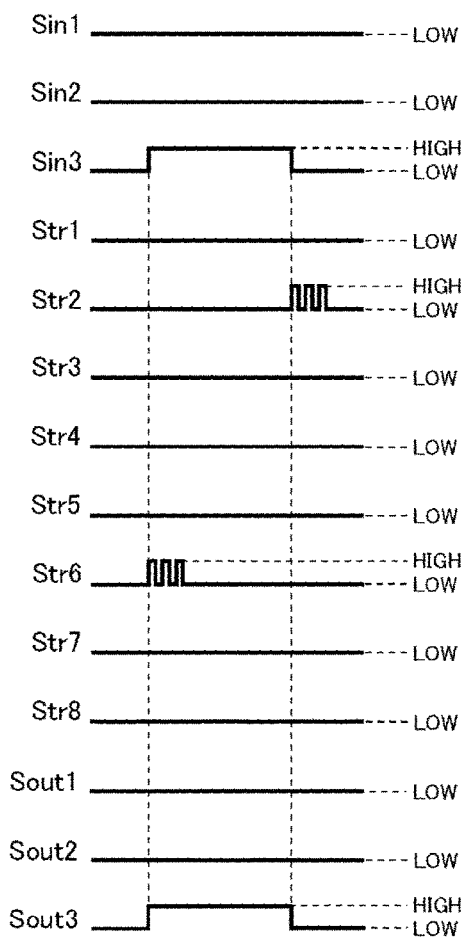
FIG. 9I is a timing chart showing an example of the operation of the signal transmission circuit shown in FIG. 8.
Figure 9J:
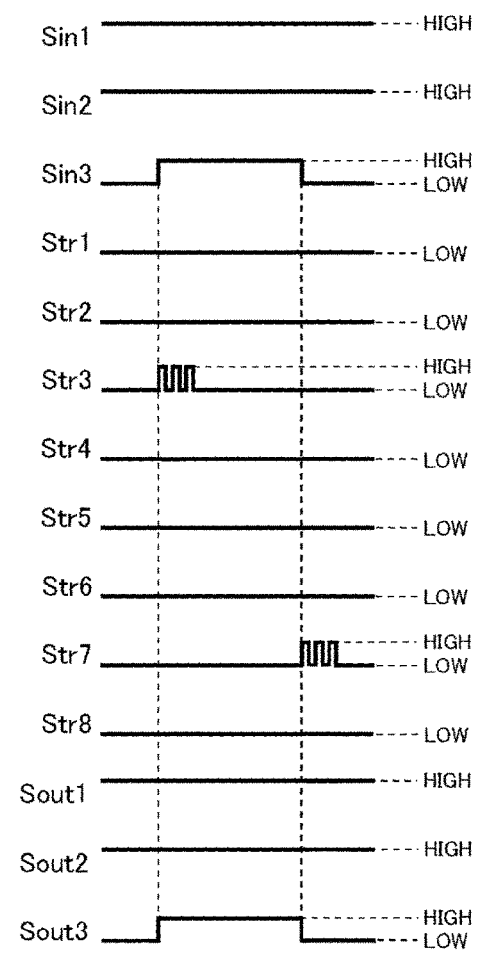
FIG. 9J is a timing chart showing an example of the operation of the signal transmission circuit shown in FIG. 8.

FIG. 8 is a diagram showing a fourth configuration example of the signal transmission circuit. FIGS. 9A to 9L are timing charts showing examples of the operation of the signal transmission circuit in the present configuration example. The signal transmission circuit of the present configuration example is a circuit for transmitting the input signals Sin1 to Sin3.

When the signal transmission circuits of the first to fourth configuration examples are generalized, a signal transmission circuit is provided which transmits N (N is a natural number of 2 or more) input signals, which includes: a transmission signal generation portion arranged to generate $2^N$ transmission signals according to the N input signals; $2^N$ transmission portions arranged respectively to transmit the $2^N$ transmission signals output from the transmission signal generation portion while performing electrical insulation; and an output portion arranged to generate and output, based on the $2^N$ transmission signals transmitted by the $2^N$ transmission portions, N output signals that respectively indicate the N input signals and in which the transmission signal generation portion generates a pulse according to the N input signals and incorporates the pulse in only one of the $2^N$ transmission signals at the same time.

Application Example of Signal Transmission Circuit

Figure 10:
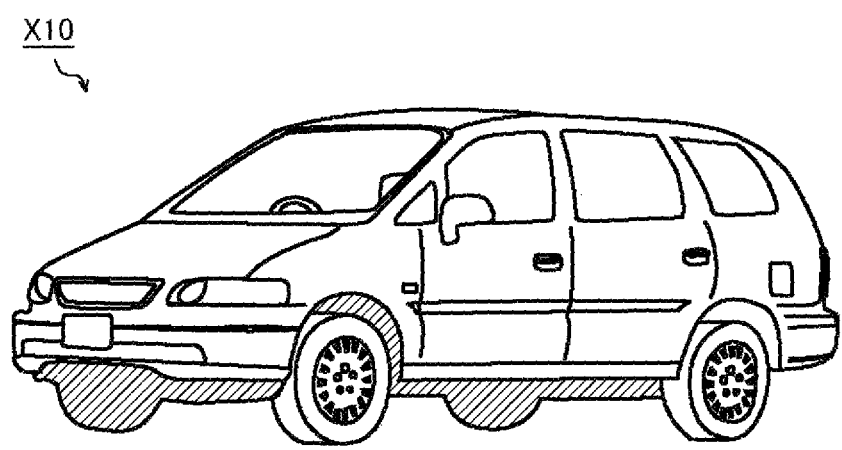
FIG. 10 is an external view of a vehicle.
Figure 11:
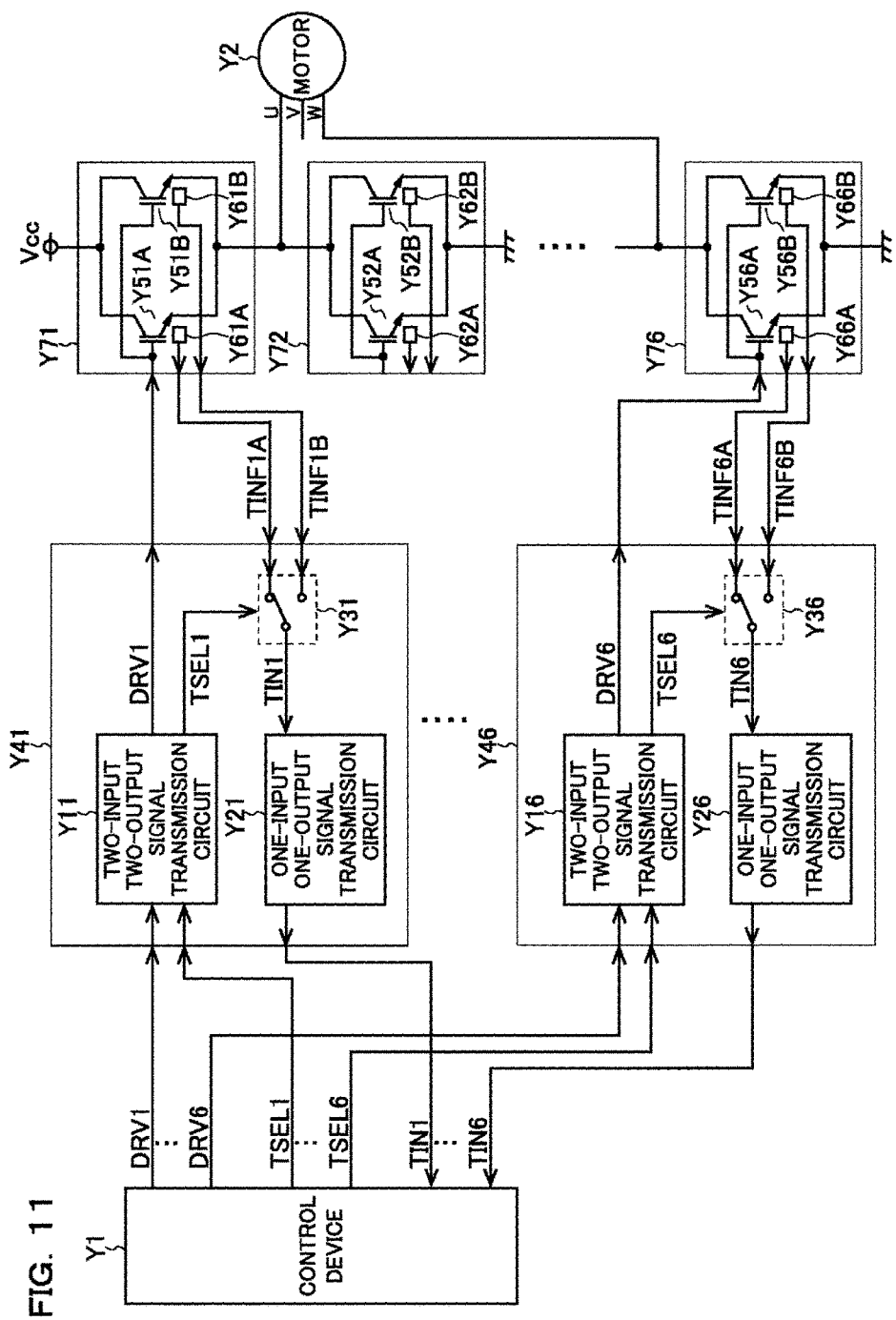
FIG. 11 is a diagram showing an example of a schematic configuration example of a motor drive system incorporated in the vehicle.

The signal transmission circuit described above can be used as, for example, part of a motor drive system which is incorporated in a vehicle X1 shown in FIG. 10. FIG. 11 is a diagram showing an example of a schematic configuration of the motor drive system incorporated in the vehicle X1.

The motor drive system shown in FIG. 11 includes a control device Y1, signal transmission portions Y41 to Y46, drive portions Y71 to Y76 and a three-phase motor Y2.

The control device Y1 generates drive signals DRV1 to DRV6 for driving the motor Y2 and temperature select signals TSEL1 to TSEL6.

Figure 12:
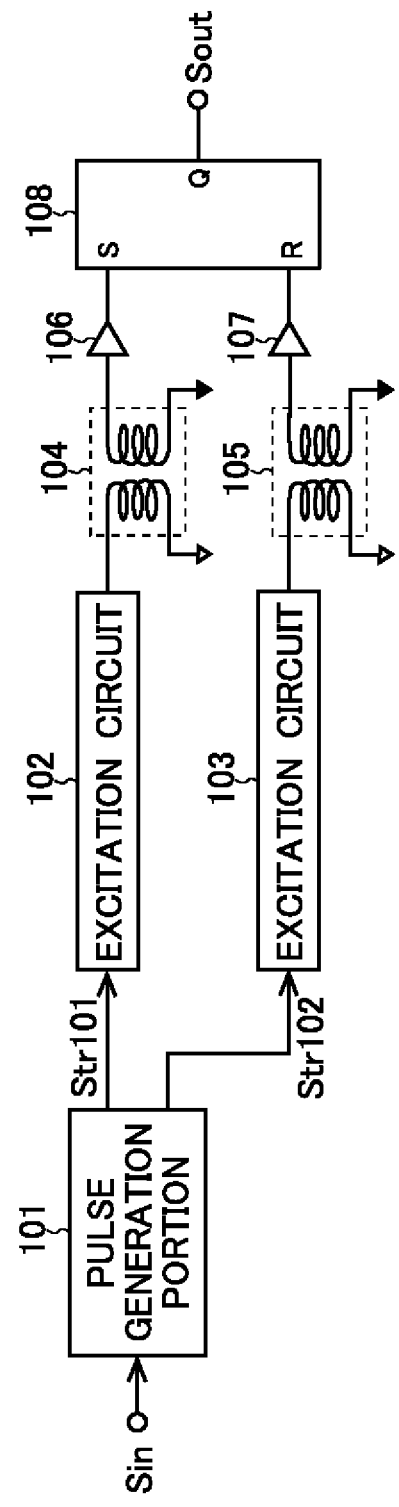
FIG. 12 is a diagram showing the configuration of a signal transmission circuit disclosed in Japanese Unexamined Patent Application Publication No. 2014-7502.
Figure 13:
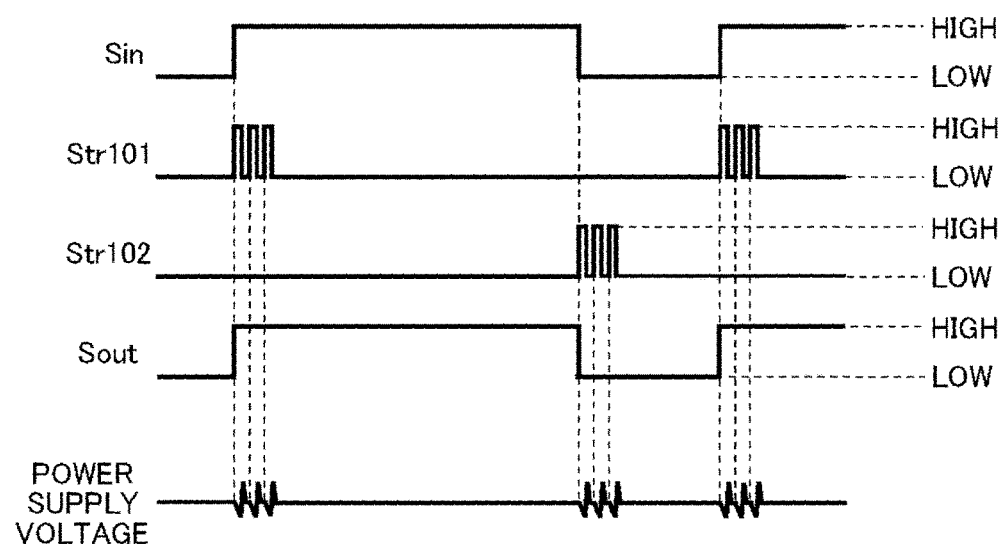
FIG. 13 is a timing chart showing an example of the operation of the signal transmission circuit shown in FIG. 12.
Figure 14:
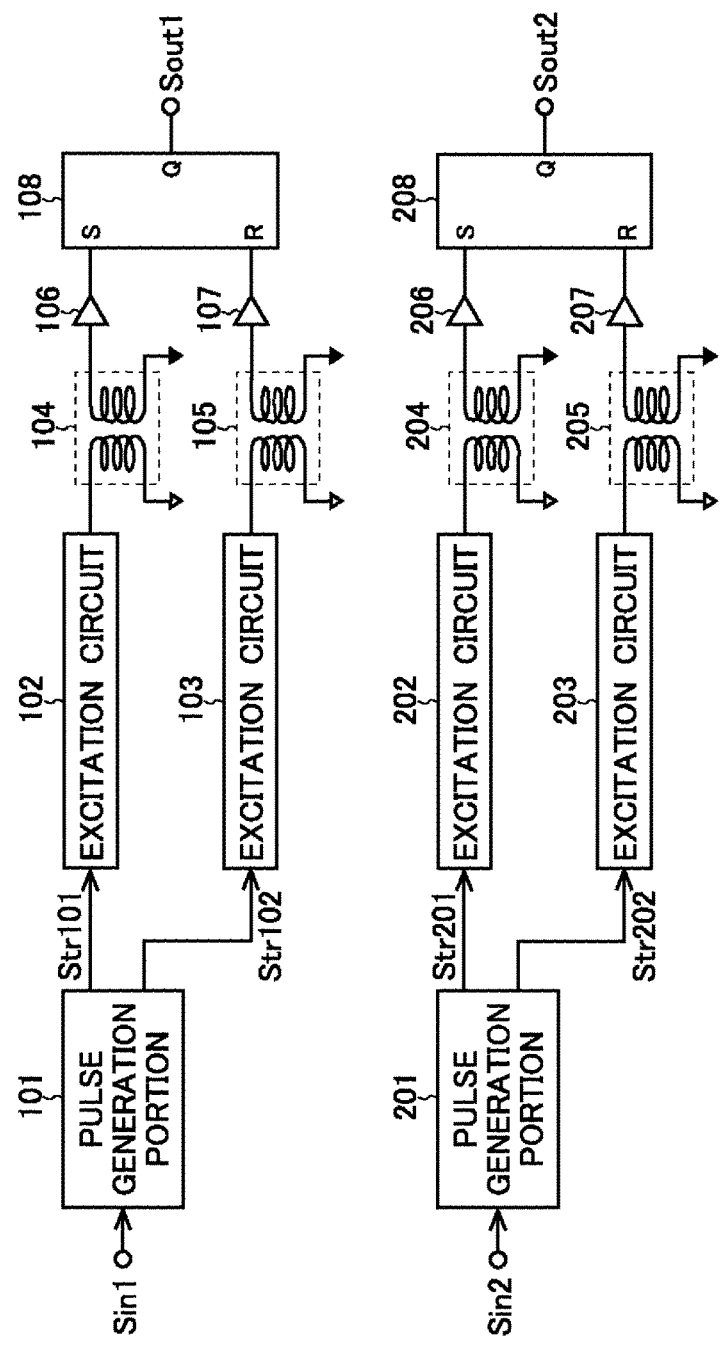
FIG. 14 is a diagram showing the configuration of a signal transmission circuit which has two signal transmission circuits of the same configuration as the signal transmission circuit shown in FIG. 12.

The signal transmission portion Y41 includes a two-input two-output signal transmission circuit Y11, a one-input one-output signal transmission circuit Y21 and a switch Y31. As the two-input two-output signal transmission circuit Y11, for example, the signal transmission circuit of the first configuration example shown in FIG. 1 can be used. As the one-input one-output signal transmission circuit Y21, for example, the signal transmission circuit shown in FIG. 12 can be used. The two-input two-output signal transmission circuit Y11 transmits the drive signal DRV1 to the drive portion Y71, and transmits the temperature select signal TSEL1 to the switch Y31. The switch Y31 inputs pieces of temperature information TINF1A and TINF1B output from the drive portion Y71. The switch Y31 supplies, to the one-input one-output signal transmission circuit Y21, as a temperature input signal TIN1, any one of the pieces of temperature information TINF1A and TINF1B according to the temperature select signal TSEL1. The one-input one-output signal transmission circuit Y21 inputs the temperature input signal TIN1 output from the switch Y31, and transmits it to the control device Y1. The signal transmission portions Y42 to Y46 also have the same configuration as the signal transmission portion Y41.

The drive portion Y71 includes insulated gate bipolar transistors (hereinafter referred to as "transistors" in short) Y51A and Y51B and temperature sensors Y61A and Y61B. The temperature sensor Y61A is arranged in the vicinity of the transistor Y51A, and the temperature sensor Y61B is arranged in the vicinity of the transistor Y51B. The temperature sensor Y61A outputs the temperature information TINF1A which is the temperature information on the transistor Y51A, and the temperature sensor Y61B outputs the temperature information TINF1B which is the temperature information on the transistor Y51B. A constant voltage Vcc is applied to the collectors of the transistors Y51A and Y51B. The drive signal DRV1 is supplied to the bases of the transistors Y51A and Y51B. The U-phase winding of the motor Y2 is connected to the emitters of the transistors Y51A and Y51B. The drive portions Y72 to Y76 also have the same configuration as the drive portion Y71. The collectors and emitters of the drive portions Y72 to Y76 are in a connection state below. The constant voltage Vcc is applied to the collectors of the drive portions Y73 and Y75. The emitters of the drive portions Y72, Y74 and Y76 are grounded. The U-phase winding of the motor Y2 is connected to the collector of the drive portion Y72. The V-phase winding of the motor Y2 is connected to the emitter of the drive portion Y75 and the collector of the drive portion Y74. The W-phase winding of the motor Y2 is connected to the emitter of the drive portion Y75 and the collector of the drive portion Y76.

Preferably, for example, when as the signal transmission circuit Y11, the signal transmission circuit of the third configuration example shown in FIG. 5 is used, the control device Y1 checks a relationship between the drive signal DRV1 and the feedback signal Sfb so as to determine whether or not an abnormality occurs in the transmission of the drive signal DRV1 and the temperature select signal TSEL1.

Points of Attention

In various technical features disclosed in the present specification, in addition to the embodiment described above, various modifications can be added without departing from the spirit of its technical creation.

For example, although in the embodiment described above, as insulating elements provided in the transmission portions and the feedback transmission portions, the pulse transformers are used, insulting elements other than the pulse transformers may be used. For example, instead of the pulse transformers, photocouplers can be used. When photocouplers are used, the excitation circuits may be removed or may be replaced with amplification circuits or the like. For example, instead of the pulse transformers, capacitors can be used. When capacitors are used, instead of the excitation circuits, discharge circuits or the like are preferably provided.

For example, various types of variations in the first configuration example may be applied to the other configuration examples. The same modification as the modification from the first configuration example to the second configuration example may be performed on the third and fourth configuration examples. The same modification as the modification from the first configuration example to the third configuration example may be performed on the fourth configuration example.

In other words, the embodiment discussed above should be considered to be illustrative in all respects and not restrictive, the technical range of the present invention is indicated not by the description of the embodiment discussed above but by the scope of claims and it should be understood that meanings equivalent to the scope of claims and all modifications belonging to the scope are included.

Overview

The signal transmission circuit described above transmits N (N is a natural number of 2 or more) input signals, and includes: a transmission signal generation portion arranged to generate $2^N$ transmission signals according to the N input signals; $2^N$ transmission portions arranged respectively to transmit the $2^N$ transmission signals output from the transmission signal generation portion while performing electrical insulation; and an output portion arranged to generate and output, based on the $2^N$ transmission signals transmitted by the $2^N$ transmission portions, N output signals that respectively indicate the N input signals, and the transmission signal generation portion generates a pulse according to the N input signals and incorporates the pulse in only one of the $2^N$ transmission signals at the same time (first configuration).

In the signal transmission circuit of the first configuration, the output portion may include 2N OR gates having $2^{N-1}$ input terminals and N latch circuits, and each of the N latch circuits may be operated based on the outputs of two of the OR gates which are connected to the input terminal of the latch circuit (second configuration).

In the signal transmission circuit of the first or second configuration, when the transmission signal generation portion detects the switching of the logic of one of the N input signals, the transmission signal generation portion may generate the pulse, and determine, according to the signal whose logic is switched, the direction of the switching of the logic and the logic of each of the (N−1) input signals other than the signal whose logic is switched, in which signal the pulse is incorporated (third configuration).

In the signal transmission circuit of any one of the first to third configurations, each time the transmission signal generation portion detects the switching of the logic of one of the N input signals, the transmission signal generation portion may generate the M (M is a natural number of 2 or more) pulses at a predetermined period (fourth configuration).

In the signal transmission circuit of the fourth configuration, while the transmission signal generation portion detects the switching of the logic of one of the N input signals, and generates the M (M is a natural number of 2 or more) pulses at the predetermined period, when the transmission signal generation portion detects the switching of the logic of one of the N input signals, the transmission signal generation portion may stop the generation of the M pulses resulting from the former detection partway, and perform generation of the M pulses resulting from the latter detection (fifth configuration).

The signal transmission circuit of any one of the first to fifth configurations may further include: a relay portion which is provided between the $2^N$ transmission portions and the output portion, and when the pulse is incorporated in one of the $2^N$ transmission signals transmitted by the $2^N$ transmission portions, and at least one of the remaining signals among the $2^N$ transmission signals transmitted by the $2^N$ transmission portions has the same logic as the pulse, the relay portion may stop the transmission of the pulse to the output portion (sixth configuration).

The signal transmission circuit of any one of the first to sixth configurations may further include: only one feedback transmission signal generation portion arranged to generate two feedback transmission signals according to one of the N output signals; only two feedback transmission portions arranged respectively to transmit the two feedback transmission signals output from the feedback transmission signal generation portion while performing electrical insulation; and only one feedback output portion arranged to generate and output a feedback signal indicating one of the N output signals based on the two feedback transmission signals transmitted by the two feedback transmission portions (seventh configuration).

In the signal transmission circuit of the seventh configuration, the feedback transmission signal generation portion may generate the two feedback transmission signals according to the output signal indicating a signal among the N input signals whose period is shortest (eighth configuration).

The vehicle described above includes the signal transmission circuit of any one of the first to eighth configurations (ninth configuration).

What is claimed is:

1. A signal transmission circuit arranged to transmit N (N is a natural number of 2 or more) input signals, the signal transmission circuit comprising:
   a transmission signal generation portion arranged to generate $2^N$ transmission signals according to the N input signals;
   $2^N$ transmission portions arranged respectively to transmit the $2^N$ transmission signals output from the transmission signal generation portion while performing electrical insulation; and
   an output portion arranged to generate and output, based on the $2^N$ transmission signals transmitted by the $2^N$ transmission portions, N output signals that respectively indicate the N input signals,
   wherein the transmission signal generation portion generates a pulse according to the N input signals and incorporates the pulse in only one of the $2^N$ transmission signals at a same time.

2. The signal transmission circuit according to claim 1,
   wherein the output portion includes 2N OR gates having $2^{N-1}$ input terminals and N latch circuits, and
   each of the N latch circuits is operated based on outputs of two of the OR gates which are connected to an input terminal of the latch circuit.

3. The signal transmission circuit according to claim 1,
   wherein when the transmission signal generation portion detects switching of logic of one of the N input signals, the transmission signal generation portion generates the pulse, and determines, according to the signal whose logic is switched, a direction of the switching of the logic and logic of each of the (N−1) input signals other than the signal whose logic is switched, in which signal the pulse is incorporated.

4. The signal transmission circuit according to claim 1,
   wherein each time the transmission signal generation portion detects switching of logic of one of the N input signals, the transmission signal generation portion generates the M (M is a natural number of 2 or more) pulses at a predetermined period.

5. The signal transmission circuit according to claim 4,
   wherein while the transmission signal generation portion detects the switching of the logic of one of the N input signals, and generates the M (M is a natural number of 2 or more) pulses at the predetermined period, when the transmission signal generation portion detects switching of logic of one of the N input signals, the transmission signal generation portion stops the generation of the M pulses resulting from the former detection partway, and performs generation of the M pulses resulting from the latter detection.

6. The signal transmission circuit according to claim 1, further comprising:
   a relay portion which is provided between the $2^N$ transmission portions and the output portion,
   wherein when the pulse is incorporated in one of the $2^N$ transmission signals transmitted by the $2^N$ transmission portions, and at least one of remaining signals among the $2^N$ transmission signals transmitted by the $2^N$ transmission portions has same logic as the pulse, the relay portion stops the transmission of the pulse to the output portion.

7. The signal transmission circuit according to claim 1, further comprising:
only one feedback transmission signal generation portion arranged to generate two feedback transmission signals according to one of the N output signals;
only two feedback transmission portions arranged respectively to transmit the two feedback transmission signals output from the feedback transmission signal generation portion while performing electrical insulation; and
only one feedback output portion arranged to generate and output a feedback signal indicating one of the N output signals based on the two feedback transmission signals transmitted by the two feedback transmission portions.

8. The signal transmission circuit according to claim 7, wherein the feedback transmission signal generation portion generates the two feedback transmission signals according to the output signal indicating a signal among the N input signals whose period is shortest.

9. A vehicle comprising:
the signal transmission circuit of claim 1.
10. A vehicle comprising:
the signal transmission circuit of claim 2.
11. A vehicle comprising:
the signal transmission circuit of claim 3.
12. A vehicle comprising:
the signal transmission circuit of claim 4.
13. A vehicle comprising:
the signal transmission circuit of claim 5.
14. A vehicle comprising:
the signal transmission circuit of claim 6.
15. A vehicle comprising:
the signal transmission circuit of claim 7.
16. A vehicle comprising:
the signal transmission circuit of claim 8.

* * * * *